United States Patent [19]
Garrett

[11] Patent Number: 5,041,829
[45] Date of Patent: Aug. 20, 1991

[54] INTERPOLATION METHOD AND SHAFT ANGLE ENCODER

[75] Inventor: David A. Garrett, Sutton, Great Britain

[73] Assignee: Muirhead Vactric Components, Ltd., United Kingdom

[21] Appl. No.: 898,332

[22] Filed: Aug. 20, 1986

[30] Foreign Application Priority Data

Aug. 22, 1985 [GB] United Kingdom ............... 8521099

[51] Int. Cl.$^5$ .............................................. H03M 1/24
[52] U.S. Cl. ...................................... 341/13; 341/116
[58] Field of Search ............... 340/347 AD, 347 DA; 341/1, 13, 106, 116, 144, 155

[56] References Cited

U.S. PATENT DOCUMENTS

| | | | |
|---|---|---|---|
| 3,218,632 | 11/1965 | Petersen | 340/347 AD |
| 3,744,050 | 7/1973 | Hedrick | 340/347 DA |
| 4,079,235 | 3/1978 | Froyd et al. | 364/107 |
| 4,421,980 | 12/1983 | Kühne | 341/13 |
| 4,648,701 | 3/1987 | Ogihara et al. | 354/439 |

FOREIGN PATENT DOCUMENTS

| | | |
|---|---|---|
| 0117683 | 9/1984 | European Pat. Off. |
| 1454538 | 11/1976 | United Kingdom |
| 2017439 | 3/1978 | United Kingdom |
| 1559484 | 1/1980 | United Kingdom |
| 2066602 | 7/1981 | United Kingdom |
| 2125645 | 3/1984 | United Kingdom |

OTHER PUBLICATIONS

Analog-Digital Conversion Notes, published by Analog Devices Inc., p. 64.

Primary Examiner—William M. Shoop, Jr.
Assistant Examiner—Marc S. Hoff
Attorney, Agent, or Firm—Saidman, Sterne, Kessler & Goldstein

[57] ABSTRACT

A method of interpolating between two signals comprising the conversion of each signal into digital form and use of the converted signals to address a memory device at each address of which is pre-stored the result of interpolation for a particular combination of values of the signals.

One embodiment of the method resides in a shaft angle encoder having: sensor means regulated by an encoder disc to produce two analogue output signals, analogue to digital conversion means which convert the said analogue signals, a memory device in which the said results are pre-stored and memory addressing means which use the converted signals to cause corresponding pre-stored results to be output from the memory device.

12 Claims, 5 Drawing Sheets

| Y | X | W | V | B | A (=V) |
|---|---|---|---|---|---|
| 0 | 0 | 0 | 0 | 0 | 0 |
| 0 | 0 | 0 | 1 | 0 | 1 |
| 0 | 0 | 1 | 1 | 0 | 1 |
| 0 | 0 | 1 | 0 | 1 | 0 |
| 0 | 1 | 1 | 0 | 0 | 0 |
| 0 | 1 | 1 | 1 | 0 | 1 |
| 0 | 1 | 0 | 1 | 0 | 1 |
| 0 | 1 | 0 | 0 | 1 | 0 |
| 1 | 1 | 0 | 0 | 0 | 0 |
| 1 | 1 | 0 | 1 | 0 | 1 |
| 1 | 1 | 1 | 1 | 0 | 1 |
| 1 | 1 | 1 | 0 | 1 | 0 |
| 1 | 0 | 1 | 0 | 0 | 0 |
| 1 | 0 | 1 | 1 | 0 | 1 |
| 1 | 0 | 0 | 1 | 0 | 1 |
| 1 | 0 | 0 | 0 | 1 | 0 |

INTERPOLATION METHOD AND SHAFT ANGLE ENCODER

BACKGROUND OF THE INVENTION

1. Field of the invention

The present invention relates to a method of interpolation and the application thereof to shaft angle encoders.

2. Description of Prior Art

Shaft angle encoders are used in a particularly wide range of applications such as machine tool control systems, antenna servo systems and tachometers. In its most basic form a photo-electric shaft angle encoder comprises a disc with a photo transmission pattern provided thereon a light source and one or more photo-detectors. The disc is fixed concentrically with a shaft and the light source and detector positioned so that light falling on the detector is intercepted by the disc. Rotation of the shaft allows illumination of the detector in accordance with the transmission pattern on the disc. The output of the photo-detector provides information concerning rotation of the shaft in the form of an electric signal. Subsequent processing of the signal depends upon the application in which the encoder is being used but in many applications it is desired to obtain more information than is inherent in the disc pattern alone. In order to achieve this various interpolation techniques are employed.

There are also two basic types of encoder disc which are employed; one containing a number of tracks with each defined sector carrying a unique transmission pattern and the other type of disc often only having a single track in which different sectors can not be distinguished. The first mentioned type of disc is known as an 'absolute' encoder disc since each defined unit of angular rotation is uniquely identifiable. The second mentioned type of disc is known as an 'incremental' encoder disc since the orientation of the disc is not identifiable from an instantaneous reading of the disc pattern, although an increment in angular rotation is identifiable. It should be noted that variations of the optical arrangement as well as non-optical sensors are also known.

In order to increase the precision with which rotation of the shaft can be determined, and in some instances to enable further information to be deduced, it is common practice to derive two output signals from respective detectors which are offset relative to each other. The output signals, which are necessarily phase related, are used as input for an interpolation technique. The interpolation typically increases the precision of detection of angle of rotation several fold and increases of several thousand fold are obtainable with some systems.

One of the most widely used techniques is based upon a ring of resistive elements into which the two detector signals and their complements are injected. Signals are read from locations diametrically opposite each other on the ring and are fed into a voltage comparator. Several sets of such signals are read from the ring and each fed into a respective comparator. The comparator outputs are capable, after further processing, of a several fold increase in resolution of angular detection of rotation. To obtain a five fold increase approximately 20 resistive elements might be required within the ring, with perhaps another 40 being required in comparator circuits. If the initial detector signals are not sinusoidal then the resistive elements will need to be of non-equal values. The comparators may have significant offset voltages of a non-standard nature and these cause variations in output with changes of temperature.

Another prior arrangement, known as an 'Optical Resolver', makes use of phase shifted signals read from the encoder disc. A system clock drives a counter, typically of 7 bits from which sequential interrogation signals are derived. These interrogation signals are used to sample each of the two disc generated analogue signals. After combining these sampled signals, the resultant is passed into a filter tuned to the count cycle frequency. The filter output is a sinewave, the phase of which varies with respect to the system clock cycle according to the relative amplitudes of the analogue inputs. A zero-crossing detector circuit acting on the filter output produces a timing pulse which transfers the instantaneous counter word into an output register. So long as the disc remains stationary, the same word will be transferred from the system clock counter to the output.

A small change in disc angle, and hence in the relative amplitudes of the two analogue signals, changes the filter output phase with respect to the system clock, and the output register receives a different word from the counter representative of the new shaft angle.

Thus, the output word varies as the shaft rotates. This arrangement gives good accuracy but has a particularly restricted upper limit upon speed of shaft rotation, due to the frequency of operation of its circuitry especially at the filtering and counting stages. In addition, complex circuitry is required and many of the components require extremely careful selection.

A further prior technique relies upon two phase shifted signals being read from the encoder disc and applied to respective deflection plates of a Cathode Ray Tube(CRT). The effect of the signals is to cause the CRT spot to describe a circuitous path on the screen, completing one revolution for each 'cycle' of the disc pattern. A stationary mechanical filter is placed between the CRT screen and a photo-detector. Such that the CRT display periodically illuminates the photo-detector. This produces a signal comprising pulses at a frequency equal to the resolution of the mechanical filter multiplied by the number of disk cycles. Thus an incremental encoder of significantly improved precision may be achieved. However, this technique is not well suited to commercial applications due to the relative expense and fragile nature of the CRT.

SUMMARY OF THE INVENTION

The present invention contemplates a method of interpolation which can be used to mitigate disadvantages of the above described encoders. The interpolation technique also has wider applications, as discussed below.

According to one aspect of the present invention there is provided a shaft angle encoder comprising an encoder disc to be fixed to a shaft, sensor means regulated by the disc to produce two analogue output signals, analogue to digital conversion means which convert the said analogue output signals to digital words each having a plurality of bits, a memory device in which the results of interpolation for particular combinations of values of the analogue signals are pre-stored at respective addresses and memory addressing means into which the digital words are input so as to cause the corresponding pre-stored results to be output from the memory device.

According to a further aspect of the present invention there is provided a method of interpolating between two signals comprising: pre-calculating the results of the required interpolation for a range of values of the signals to be interpolated, pre-storing the pre-calculated results at respective addresses of a memory device, converting the signals into digital form, using the converted signals to address the said memory device, and reading out the respective results from the memory device.

BRIEF DESCRIPTION OF DRAWINGS

Embodiments of the invention will now be described by way of example only and with reference to the accompanying drawings, in which.

DESCRIPTION OF THE PREFERRED EMBODIMENTS

Figure 1A:
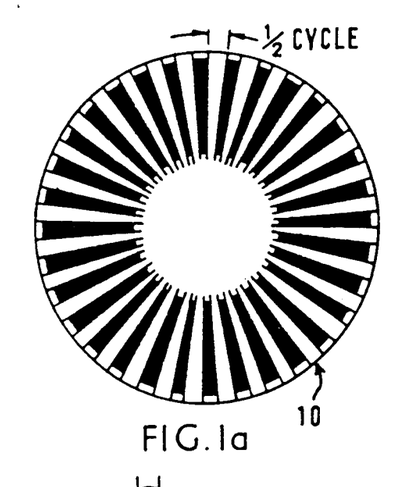
FIGS. 1a and 1b illustrate encoder discs.
Figure 1B:
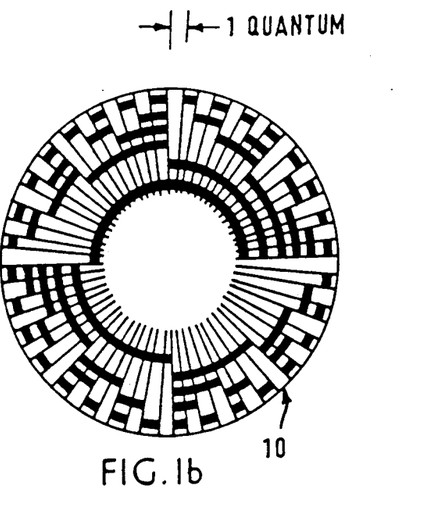

FIG. 1 illustrates two types of encoder disc. FIG. 1a shows the so called incremental encoder disc whereas FIG. 1b shows the so called absolute encoder disc. One quantum of the pattern of the absolute encoder disc is shown in each of FIGS. 1a and 1b. The nature and use of these discs is well known.

Figure 2:
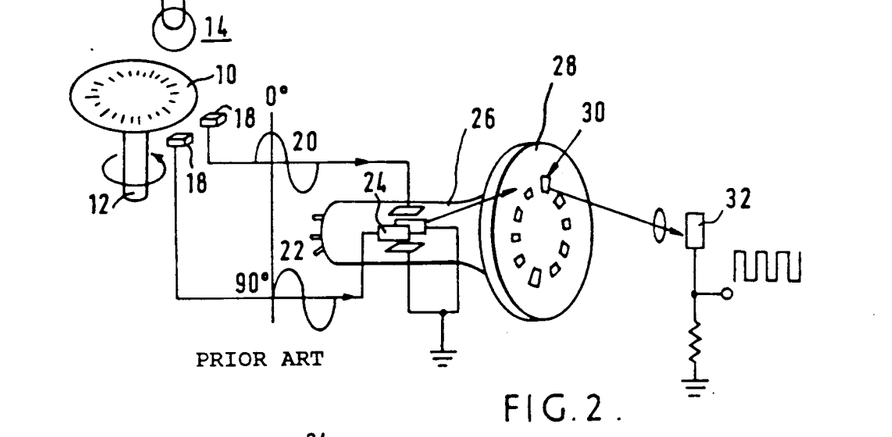
FIG. 2 illustrates the prior arrangement in which signals are applied to a CRT.

FIG. 2 is a schematic illustration of the technique which applies signals to a CRT. An encoder disc 10 is attached to a rotatable shaft 12 which may form part of or be connected to and suitable component from a very wide range of applications, as mentioned above. The disc 10 regulates light from a light source 14 with respect to two photodetectors 16 and 18. Photodetectors 16 and 18 are offset with respect to each other so as to produce, as the shaft rotates, respective output signals 20 and 22 which have a phase difference between them. Often the signals 20 and 22 will have approximately sinusoidal quadrature waveforms.

The sinusoidal quadrature signals 20 and 22 are applied to the X-Y plates 24 of a CRT 26, as shown, and the CRT spot describes circles. A stationary mechanical filter, in the form of a disc 28 having a regular pattern of segment apertures 30, is placed on the CRT screen. Illumination from the CRT 26 thus falls periodically upon an adjacent photodetector 32 which produces a resultant square wave output, the pulses of which indicate rotation of the shaft through a unit of angular rotation. It will be apparent that the unit of rotation is equal to 360° divided by the product of the number of cycles of the encoder disc and the number of apertures of the mechanical filters.

The present invention enables a similar solution to be obtained whilst avoiding the disadvantages of high voltage, expense and the relatively fragile nature and bulk of CRTs. Moreover, the solution can be extended to provide facilities not available with the prior arrangement.

Figure 3:
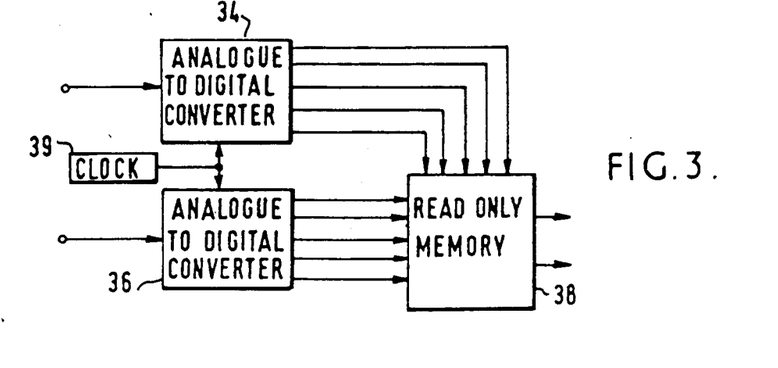
FIG. 3 illustrates an embodiment of the present invention.

FIG. 3 illustrates schematically an embodiment of the invention as applied to a shaft angle encoder. The two output signals 20 and 22 derived from the encoder disc 19 are applied to respective Analogue to Digital Converters 34. 36 and the output thereof are used to address a PROM 38. The contents of the PROM address are output and as the shaft 12 rotates the output of the Analogue to Digital Converters 34, 36 will vary and different locations within the PROM 38 will therefore be addressed.

The information stored at each address within the PROM is the result of interpolation between the two encoder signals 20 and 22 so as to determine the angular rotation of the shaft 12. These results are pre-calculated and pre-stored. Most analogue to digital converters operate on a clock system and a clock circuit 39 is indicated in FIG. 3.

Obviously, in the simple arrangement of FIG. 3 only an incremental encoder is provided since the PROM addresses will be cycled and the output from the PROM 38 is analogous to that of photodetector 32 of the arrangement of FIG. 2. However, the embodiment of the invention is far more versatile than the prior arrangement since the information stored at the appropriate address locations within the PROM can be of a nature not necessarily directly indicative of angular rotation of the shaft. This is of particular benefit where the encoder is being used in a control system or the like since it may be possible to provide meaningful control commands directly in a form acceptable to subsequent circuitry. In addition, the parameters represented by the stored information can be varied readily by substitution of PROMs or by use of EEPROMs (Electrically Erasable programmable Read Only Memory). Indeed given that PROMs provide, typically. 8 output bits, one PROM can encode to 8 different interpolation factors simultaneously or output various phases of similar factors.

The information stored in the PROM can additionally provide self checking of the encoder. Should the output of the sensors be undesirably low or high, then the outputs from the Analogue to Digital converters will address a part of the PROM which can have an output bit or bits coded to give a warning. Such a facility could be used to check upon quantisation errors and the like.

The ultimate resolution of the encoder is dependent upon the basic unit of quantisation provided by the Analogue to Digital Converters, although in practical terms speed of operation of the Analogue to Digital Converters may also be a prime consideration. Thus, each cycle of the encoder disc may be sub-divided in accordance with the number of addresses available in the memory and the number of unique words produced by the Analogue to Digital Converters. Analogue to Digital Converters are available with resolutions of up to 8 bits operating at up to 100 MHz although the cost of such components may at present be relatively high. The following are examples of suitable components which are available at lower cost than the above example:

the so called 'flash' Analogue to Digital Converter with 6 bit resolution and an operating speed of approximately 100 nano-seconds, and the so called 'tracking' Analogue to Digital Converter with 10 bit resolution and an operating speed of 1 micro-second.

Suitable memory devices are available at comparable costs. For example, a Bipolar PROM of a 64×64 matrix of 4 bit words with an access time of the order of 50 nano-seconds would be comparable in cost to the above 2 examples. Significantly less expensive memory devices may be suitable for applications which do not require such fast access times. An example of such a device is a CMOS EPROM of 64×64 matrix of 8 bit words having access times of the order of 500 nano-seconds.

As the operational parameters of the encoder approach the limits of resolution and speed of operation of the components used, certain phenomena may become apparent. The mark to space ratios will tend to vary as resolution is increased and since most Analogue to Digital Converters use a clocking system, increased speeds may result in clocking phenomena beginning to appear on the Converters outputs. However, such influences can in the majority of cases be avoided by selection of suitable analogue to digital converters and PROMs and are unlikely to become noticeable in applications for which prior arrangements are currently employed. In particular, application of the present invention to shaft angle encoders enables similar resolutions and accuracies as obtained by the 'Optical Resolvers' but with faster respose and with far superior flexibility in resolution. This embodiment of the invention is capable of superior resolution and avoids the plethora of resistors, comparators and gates, with the attendant danger of codes appearing out of sequence should drift occur, as are inherent in the prior system which is based upon phase relationships within a resistive ring.

A particularly beneficial advantage of the encoder of this invention is the capability of generating more than one resolution from a single disc cycle. For example, a 2×2.500 cycle disc could be used to generate resolutions of 2×10,000, 2×75,000, 2×12,500, etc simultaneously—simply by storing the appropriate values in the PROM.

Figure 4:
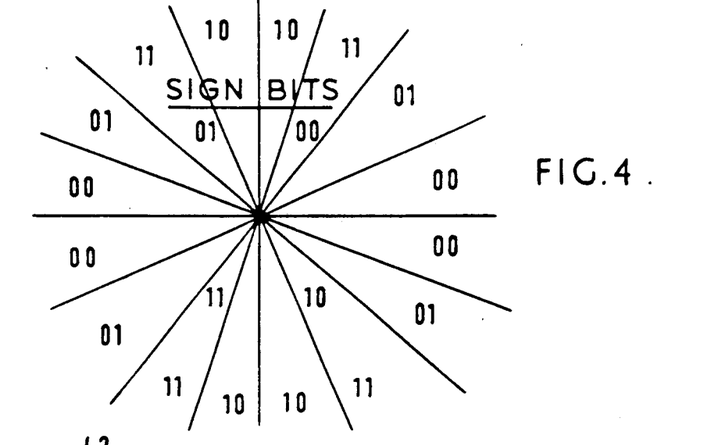
FIG. 4 illustrates the encoding of a cycle into 4 cycles of incremental quadrature signals.
Figure 5A:
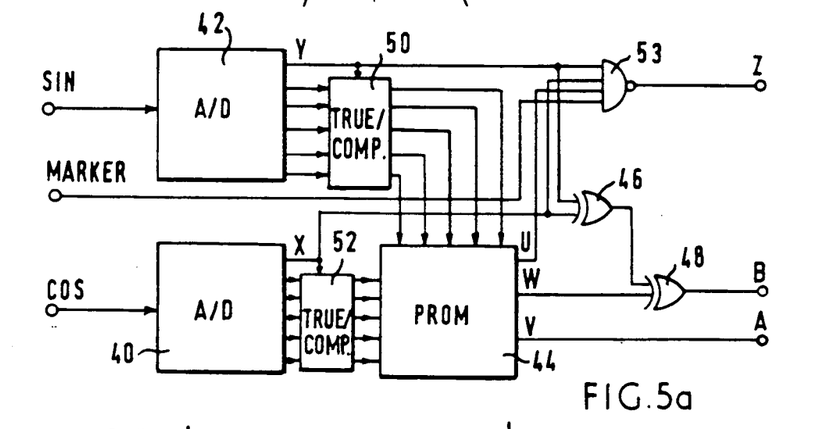
FIG. 5 is a block diagram of an incremental encoder adapted for use with reduced memory storage.
Figure 5B:
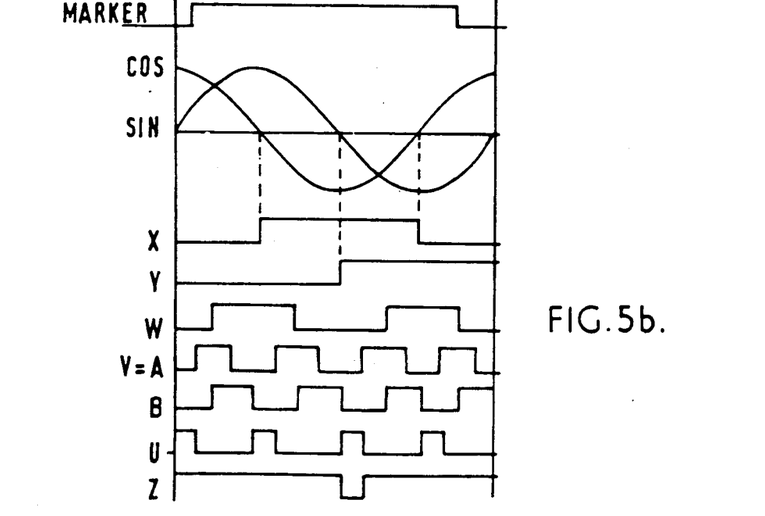

An additional feature of this embodiment is that the memory device need only store the results of interpolation for one quadrant. The most significant bit of each Analogue to Digital Converter output is used to indicate quadrant of the input cycle. This is illustrated in FIG. 4. Two bits indicate quadrant and the remaining two bits indicate sector within the quadrant. If the memory device is restricted to data, the results of interpolation, for one quadrant, then as the address output by the Analogue to Digital Converters moves into alternate quadrants one of the Converter outputs should be complemented. Also each address should be complemented when its sign bit is a one, so that the address locus rebounds at the end of each quadrant. This can be achieved by gates as illustrated in FIG. 5. It should be noted that this is an alternative arrangement for use when it is desired to avoid storing information for a full cycle in the memory device.

FIG. 4 illustrates the encoding of a cycle to produce quadrature square waveforms at 4×disc resolution. The outer bits indicate the PROM outputs before complementing W to produce B. This is an incremental encoding example. The sequence shows how using the sign bits to complement the PROM input code, as in FIG. 5, causes a reflection effect at each quadrant boundary.

Figure 6:
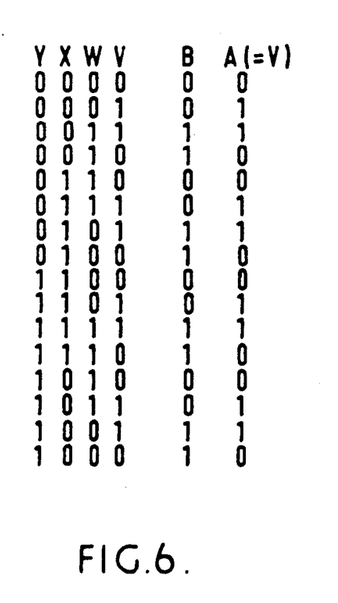
FIG. 6 is a table of signal values associated with the arrangement of FIG. 5.

FIG. 6 is a truth table for FIGS. 4 and 5.

Figure 7:
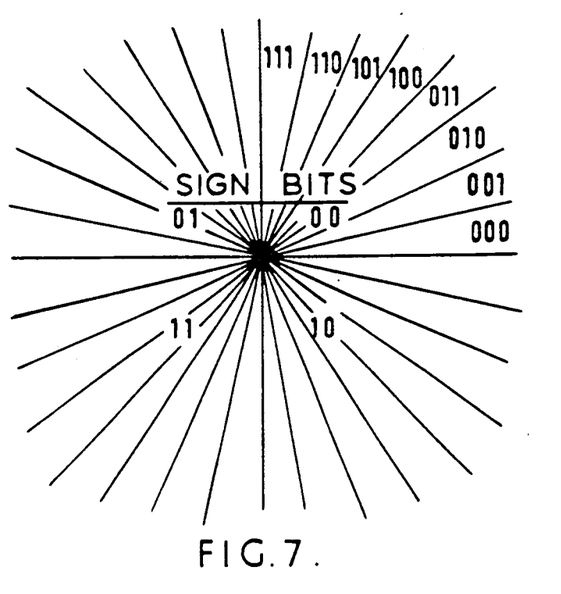
FIG. 7 illustrates the absolute encoding of a cycle using a 5 bit code.
Figure 8:
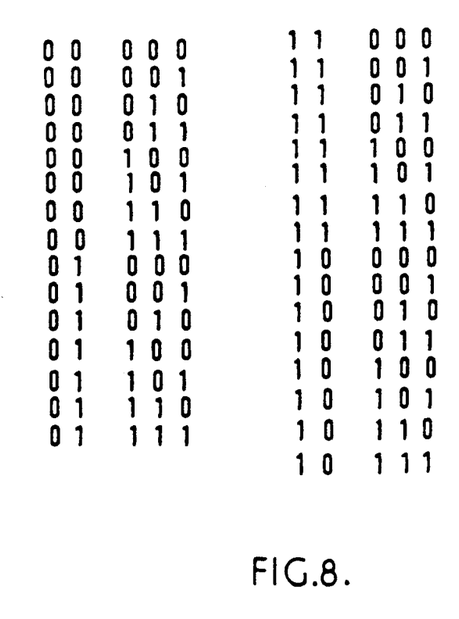
FIG. 8 is a table of signal values associated with the coding shown in FIG. 7.
Figure 9:
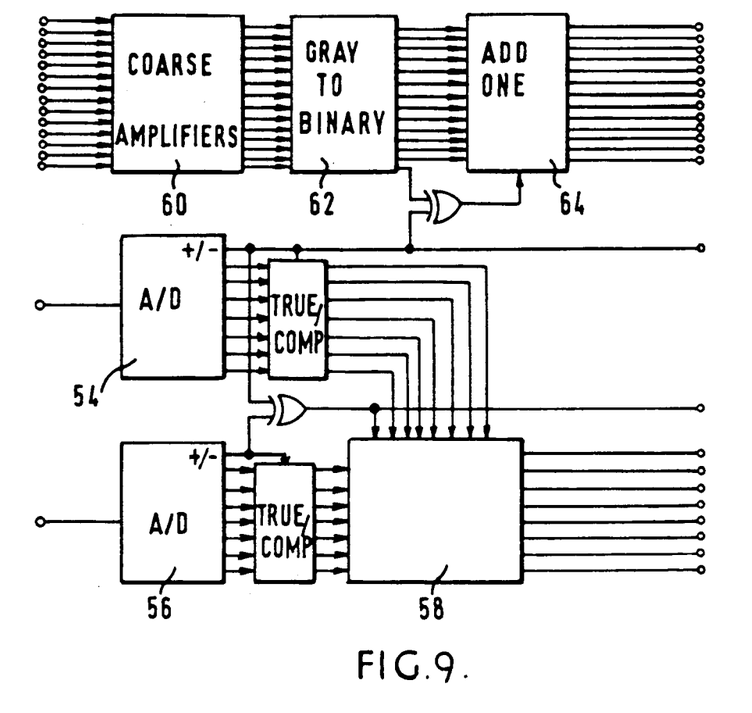
FIG. 9 is a block diagram of an absolute encoder.

FIG. 7, 8 and 9 illustrate absolute encoding interpolation. In particular FIGS. 7 and 8 show interpolation of one disc pattern cycle into 32 codes. FIG. 9 illustrates an arrangement for providing such interpolation, with the interpolation extended to 1024 codes per disc pattern cycle(10 bits), plus the correlation with a 14 bit coarse code.

The arrangement of FIG. 5 comprises two 6 bit Analogue to Digital Converters 40 and 42 together with a PROM 44. PROM 44 stores the results of interpolation for one quadrant only and the most significant bit. X and Y, from each Analogue to Digital Converter are input into an Exclusive - OR gate 46 the output of which is input into an Exclusive - OR gate 48 together with the signal W of the PROM output. The most significant bit, X Y, from each Analogue to Digital Converter also drives a respective True/Complement circuit 50. 52 which acts upon the remaining 5 bits of the Analogue to Digital Converter output, as required for quadrant boundary changes.

FIG. 6 is a signal value table showing the digital values of the signals generated in the circuit of FIG. 5. That is, the most significant bits X and Y of the Analogue Digital Converters, the PROM outputs W and V and the final encoder outputs A and B. The table is limited, for the sake of simplicity, to x 4 interpolation. That is each cycle of the encoder disc is effectively sub-divided into 4 cycles and the final output from the FIG. 5 circuit is of 2 bit form.

An advanced practical unit using 8 bit Analogue to Digital Converters and a 4096 (64×64) word PROM should be capable of practical implementation of a×80 interpolation.

A separate output from the PROM gives one short pulse per cycle of disc pattern (or quarter cycle for a PROM coded over a quadrant) which could be gated with the disc marker to give one pulse per revolution. The circuit of FIG. 5 also shows the implementation of such a zero marker, signal Z. Signal Z is derived from a 4 input NAND gate 53 whose inputs are the most significant bits X and Y of the Analogue to Digital Converters, an auxiliary output U from the PROM and a marker signal derived from the encoder disc detectors. In fact, the zero marker signal Z can be generated over a wide choice of angles, although it may generally be required coincident with a particular combination of count output states.

For absolute encoder interpolation, the PROM would be programmed as illustrated in FIG. 7.

FIG. 8 lists the two sign bits and three PROM output bits as they could be obtained by complementing the latter in alternate quadrants. The listing demonstrates that a natural binary sequence can thereby be obtained from the three PROM derived bits, but that one sign bit requires inversion in the second half-cycle in order to produce a conventional 5 bit natural binary sequence.

The main circuitry of FIG. 8 is, of course, similar to that of FIG. 5. However, the Analogue to Digital Converters, 54 and 56, are shown as 8 bit devices and instead of using Exclusive-OR gates to produce the ones complement of the PROM output, a larger (128×256) PROM 58 is used. The PROM address is still complemented when the sign bits are ones. More bits of the PROM output need to be coded to implement an absolute encoder and the interpolation bits have to be correlated with the directly read coarse code. The circuit of FIG. 8 illustrates use of an 'add 1' technique to achieve correlation, with the PROM words being coded in natural binary. This is a relatively simple technique in which the output word derived from the 14 bit gray signal input from an absolute encoder disc, that is the signal read from 14 tracks on the disc, is incremented when the least significant coarse bit, When converted natural binary, differs from the most significant bit of the fine (interpolated) word. The 14th coarse bit is, in fact, a redundant bit only used for correlation. The 14th output bit from the ADD-1 circuitry is therefore omitted. The fine quadrature signals are derived from an additional track or tracks having one half cycle per quantum of coarse code. Typically this may comprise 2 ×8192 cycles. Since the Analogue to Digital Converters are 8 bit, the output capability of the circuitry is a 23 bit output word. The practical limit of resolution would be 21 bit natural binary but the extra bits could enable binary coded decimal codes to be employed, eg. 0-359999 and 0-639999.

The coarse signal input available on inputs 1-14 of the arrangement of FIG. 8 are amplified by respective amplifiers contained in block 60 and are then subjected to conversion into binary signals in block 82. Conversion into binary is required in order to enable use of the add 1 technique.

The present invention can be applied to shaft angle encoders which use optical sensors other than that described above and can be applied to encoders which use non-optical sensors eg, magnetic sensors. A specific example of an alternative optical sensor is one in which the encoder disc causes polarisation of illumination from the light source. The photodetectors are returned and each has a respective polarisinq filter placed between it and the disc. The planes of polarisation of these filters are mutually inclined at 45°. This produces two sinusoidal quadrature signals per revolution of the disc which are applied to the analogue to digital converters as described above.

The broad principle of the present invention residing in a method of interpolation has been described above in considerable detail in its application to shaft angle encoders. However, it will be immediately apparent to those skilled in the art that the broad principle of the present invention is equally applicable to many other applications. Examples of such applications are synchro to digital converters, fibre optic transducers and power meters.

A further application of the broad concept of the present invention resides in use of the method of interpolation in a synchro-to-digital resolver. This is described with reference to FIG. 10.

A synchro resolver, when excited by A.C., produces two outputs, both at the excitation frequency, but with amplitudes proportional to the sine and cosine of the shaft angle respectively. BY sampling the (stator) outputs synchronously with reference (rotor) excitation, the relative sine and cosine amplitudes are obtained. These sampled Voltages are converted to digital words and used to address a suitably coded PROM, as previously described, to yield absolute or incremental data.

Compared with conventional resolver-to-digital conversion techniques, such a system can operate at particularly high speeds, especially if flash analogue to digital converters are employed. The conversion time can be very fast even if several resolvers are multiplexed into one such interpolator, since no counting or tracking is involved.

The use of a synchro resolver which has 3 phased outputs instead of the above described two, can be accommodated by either 3 analogue to digital converters and more complex PROM programming or reduction to 2-phase signals by means of a Scott-T transformer.

Figure 10:
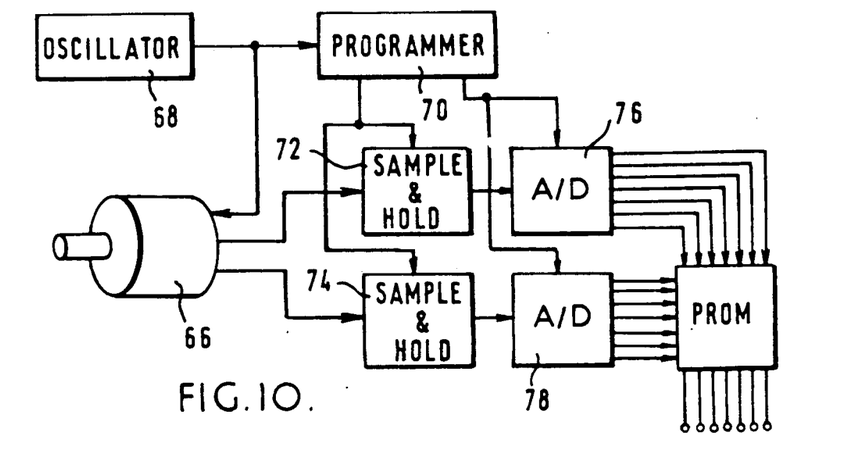
FIG. 10 is a block diagram of a synchro-to-digital resolver.

A simple resolver-to-digital converter arrangement is illustrated in FIG. 10. The resolver 66 receives an input from an oscillator 68 which also feeds a programmer 70. The programmer 70 applies control signals (timing signals) to two sample-and-hold circuits 72 and 74 and two analogue to digital converters 76 and 78. Outputs from the analogue to digital converters address a PROM 80 Which produces the final output word. Outputs from the resolver 66 are applied to respective sample-and-hold circuits 72 and 74 which in turn supply signals to the converters 76 and 78. Processing between the converters 76 and 78 and the PROM 80 is the same as described above for other embodiments of the invention.

Figure 11:
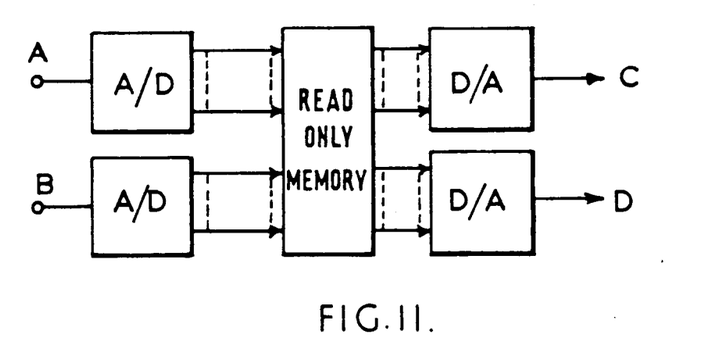
FIG. 11 a block diagram of a circuit for increasing the resolution of two sinusoidal waveforms.
Figure 12:
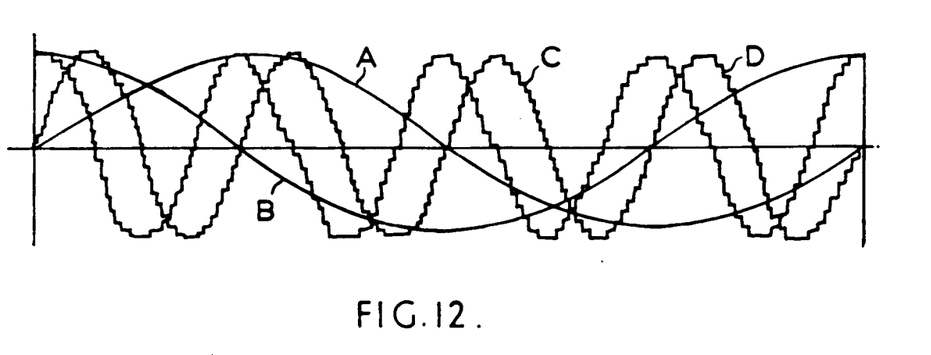
FIG. 12 is a waveform diagram showing the inputs and outputs of the circuit of FIG. 11.

FIGS. 11 and 12 illustrate an application of the method of interpolation of the present invention to provide a high resolution encoder output. The desired output is in the form of two sinusoidal-like signals which are in quadrature. It is extremely difficult to produce an encoder capable of providing directly very high resolution quadrature signals. However, in the arrangement of FIG. 11 the two quadrature signals. A and B, from a normal encoder are digitised and used to address a ROM which is programmed to output a digitised analogue sequence. This sequence undergoes digital to analogue conversion to produce output signals C and D. The output signals are not smooth waveforms and exhibit small quantisation discontinuities. Such slight imperfection in the output waveforms can be reduced to the level at which it is effectively imperceptible. FIG. 12 illustrates a four fold increase in resolution. The resolution in the amplitude axis can be selected using the required number of output bits from the ROM. The angular axis resolution varies in the manner described above in relation to quantisation error. That is, the angular resolution is dependent upon the number of bits generated to address the ROM. Furthermore, it will be readily apparent that this arrangement can be used to effect changes other than or in addition to changes in resolution. In particular, changes in output waveform shape can be achieved. The phase between two output signals can be changed. It is possible to effect phase angle multiplication. That is, the frequency of a signal can be increased by a whole integer factor. These techniques can be used in various combinations over virtually any input frequency range.

Fibre optic transducers are becoming of increasing importance in industry because of their safety features; eg, no risk of sparking, and high integrity data transmission. The method of the present invention may be used in fibre optic transducer applications in order to avoid non-linearities which are inherent in many existing components used With fibre optics. The method of the present invention can be used to determine the relative colour content of a fibre optic signal, amplitude of the signal, or frequency of modulation of the signal.

Such fibre optic systems may incorporate optical transducers in which the value of the parameter to be measured determines the wavelength of light transmitted by the transducer. An example is a grating monochromator which converts angular displacement into a change in wavelength. Hence measurement of change of wavelength enables the angular position of the grating to be measured. Linear displacement can be measured by use of a Fresnel zone plate. A Fresnel zone plate has the property of focussing all incident light at a single point for each wavelength. Thus, for multi-wavelength incident light, a change of wavelength is recorded as the plate is displaced linearly. In each case one optical fibre is used to supply white light and another fibre is used to collect a narrow range of focussed wavelength. Both examples have the advantages that they are independent of the quantity of light and require only measurement of wavelength. If the output of the transducers is directed to a pair of detectors of different spectral sensitivities then the signals from those detectors can form the input to the analogue to digital converters of the arrangement of the present invention.

As a further example, the method of the present invention can be used in a voltage measuring instrument. Analogue signals are converted to digital signals which are then used to address a PROM. The PROM stores correction factors to overcome non-linearities in the response of the measurement transducer. Current can also be measured in the same manner. Thus, for DC signals, it is possible to obtain a digital reading of power by using both the voltage and current inputs via respective Analogue to Digital Converters to address a precoded PROM. For an AC circuit it is possible to use the power factor as a third dimension and thereby achieve a meaningful digital reading of AC power. It is possible to provide such a three dimensional array simply by provision of, say, a 12 input PROM with allocation of 4 inputs per dimension. This technique can be extended into further dimensions, such as time, dividing the PROM inputs between the Variables as appropriate.

Hence, it will be appreciated from the above description that the method of interpolation of the present invention is a powerful tool which can be used in a very wide range of applications.

What I claim is:

1. A shaft angle encoder comprising:
    an encoder disc to be fixed to a shaft,
    sensor means regulated by said disc to produce first and second analog output signals,
    analog to digital conversion means which converts said analog signals to respective digital words each having a plurality of bits,
    a memory device containing data comprising interpolation results for particular combinations of values of said analog signals, pre-stored at respective addresses, and
    memory addressing means connected to receive said digital words and to cause the corresponding pre-stored results to be output from an address in said memory device which is determined in accordance with said respective digital words.

2. An encoder as claimed in claim 1, wherein said analog to digital conversion means comprises at least one analog to digital converter.

3. An encoder as claimed in claim 1, wherein said memory device comprises a Read Only Memory.

4. An encoder as claimed in claim 1, wherein said stored results include command signals for subsequent circuitry.

5. An encoder as claimed in claim 1, wherein said memory device contains, at certain addresses therein, error messages which are output from said memory device when the signals from said analog to digital conversion means lie outside a predetermined range.

6. An encoder as claimed in claim 1, wherein
    said memory device stores the results of interpolation for one quadrant only; and
    said addressing means comprises means for effecting address changes at quadrant boundaries.

7. An encoder as claimed in claim 1, wherein said encoder disc provides an absolute encoder.

8. An encoder as claimed in claim 1, wherein
    said memory device contains interpolation results corresponding to less than a full cycle of said analog signals;
    said addressing means comprises means for causing said results to be output from an address in said memory device which is modified in accordance with the instantaneous quadrant position of said encoder disc; and
    said addressing means also comprises means for modifying said pre-stored results in accordance with the quadrant position of said encoder disc.

9. A method of providing interpolation results in accordance with two input signals, comprising:
    pre-calculating the results of the required interpolation for a range of values of the signals to be interpolated,
    pre-storing the pre-calculated results at respective addresses of a memory device,
    converting the signals into digital form,
    addressing the said memory device at an address defined in accordance with said converted signals, and
    outputting the respective results from said memory device.

10. A method of measuring a shaft angle position, comprising the steps of:
    sensing the position of an encoder disc with first and second sensors, which provide respective analog output signals;
    converting said respective analog signals to respective digital words;
    looking up angular position values in a memory device at an address which is determined in accordance with values of said respective digital words.

11. A linear encoder comprising:
    sensor means disposed to produce first and second analog output signals corresponding to position of an element;
    analog to digital conversion means which converts said analog signals to respective digital words each having a plurality of bits;
    a memory device containing data comprising interpolation results for particular combinations of values of said analog signals pre-stored at respective addresses; and
    memory addressing means, connected to receive said digital words and to cause the corresponding pre-stored results to be output from an address in said memory device which is determined in accordance with said respective digital words.

12. A synchro to digital converter comprising:
    a resolver disposed to produce first and second analog output signals corresponding to angular position of a shaft,
    analog to digital conversion means which converts said analog signals to respective digital words each having a plurality of bits, a memory device containing data comprising interpolation results for particular combinations of values of said analog signals pre-stored at respective addresses, and memory addressing means, connected to receive said digital words and to cause the corresponding pre-stored results to be output from an address in said memory device which is determined in accordance with said respective digital words.

* * * * *